(12) United States Patent  
Tinker

(10) Patent No.: US 7,724,861 B2
(45) Date of Patent: May 25, 2010

(54) SAMPLE RATE CONVERTER

(75) Inventor: Darrell Eugene Tinker, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 1073 days.

(21) Appl. No.: 11/386,873

(22) Filed: Mar. 22, 2006

(65) Prior Publication Data

US 2007/0223640 A1 Sep. 27, 2007

(51) Int. Cl.
H03D 3/24 (2006.01)
(52) U.S. Cl. ..................................... 375/376
(58) Field of Classification Search .............. 375/376, 375/216, 356; 327/115, 119
See application file for complete search history.

(56) References Cited

U.S. PATENT DOCUMENTS

| | | | |
|---|---|---|---|
| 4,617,520 A * | 10/1986 | Levine ........................ | 327/12 |
| 4,625,126 A | 11/1986 | Tinker et al. | |
| 4,653,076 A * | 3/1987 | Jerrim et al. ................ | 375/367 |
| 5,185,609 A | 2/1993 | DeBord | |
| 5,559,513 A | 9/1996 | Rothermel et al. | |
| 5,617,344 A | 4/1997 | Young et al. | |
| 5,634,116 A | 5/1997 | Singer | |
| 5,796,995 A | 8/1998 | Nasserbakht et al. | |
| 5,915,028 A | 6/1999 | Chahabadi | |
| 5,949,363 A | 9/1999 | Kosiak et al. | |
| 6,055,619 A | 4/2000 | North et al. | |
| 6,057,793 A | 5/2000 | Gong et al. | |
| 6,061,704 A * | 5/2000 | Ostman et al. ............... | 708/313 |
| 6,175,269 B1 | 1/2001 | Gielis et al. | |
| 6,184,942 B1 | 2/2001 | Patel et al. | |
| 6,208,671 B1 | 3/2001 | Paulous et al. | |
| 6,211,924 B1 | 4/2001 | Patel et al. | |
| 6,310,653 B1 | 10/2001 | Malcolm, Jr. et al. | |
| 6,333,767 B1 | 12/2001 | Patel et al. | |
| 6,362,755 B1 | 3/2002 | Tinker | |
| 6,373,912 B1 | 4/2002 | Yu | |
| 6,480,233 B1 | 11/2002 | Limberg | |
| 6,512,555 B1 | 1/2003 | Patel et al. | |
| 6,523,147 B1 | 2/2003 | Kroeger et al. | |
| 6,526,101 B1 | 2/2003 | Patel et al. | |
| 6,584,145 B1 | 6/2003 | Camagna et al. | |
| 6,584,162 B1 | 6/2003 | Tinker | |
| 6,694,026 B1 | 2/2004 | Green | |
| RE38,456 E | 3/2004 | Patel et al. | |
| 6,700,936 B1 | 3/2004 | Moss | |
| 6,701,140 B1 | 3/2004 | Stine | |
| 6,738,610 B1 | 5/2004 | Wildhagen | |
| 6,778,106 B2 * | 8/2004 | Lenez et al. ................ | 341/61 |
| 6,801,028 B2 | 10/2004 | Kernahan et al. | |
| 7,071,773 B2 | 7/2006 | Kuhn et al. | |
| 7,079,657 B2 | 7/2006 | Wu et al. | |
| 7,106,224 B2 | 9/2006 | Knapp et al. | |
| 7,180,349 B2 | 2/2007 | Leifso et al. | |

(Continued)

Primary Examiner—David C Payne
Assistant Examiner—Leon-Viet Q Nguyen
(74) Attorney, Agent, or Firm—Toler Law Group

(57) ABSTRACT

A system and method for determining a clock rate of a digital phase lock loop is disclosed. The system includes a first input to receive a first clock signal, an output to provide a second clock signal, and a dividerless initial clock rate determination module to calculate an initial clock rate value based on an reciprocal of a pulse length of the first clock signal. In a particular embodiment, the dividerless initial clock rate determination module performs a piecewise linear operation to calculate the initial clock rate value.

16 Claims, 6 Drawing Sheets

U.S. PATENT DOCUMENTS

| | | |
|---|---|---|
| 7,271,631 B2 * | 9/2007 | Watanabe .................. 327/115 |
| 2001/0040930 A1 | 11/2001 | Abbey |
| 2002/0126027 A1 * | 9/2002 | Walker ....................... 341/76 |
| 2004/0032922 A1 | 2/2004 | Knapp et al. |
| 2004/0075766 A1 | 4/2004 | Schoner |
| 2004/0264614 A1 | 12/2004 | Tinker |
| 2005/0207387 A1 * | 9/2005 | Middleton et al. .......... 370/347 |
| 2005/0229235 A1 * | 10/2005 | Loyer ........................ 725/152 |
| 2006/0077300 A1 | 4/2006 | Cheon et al. |
| 2006/0179095 A1 | 8/2006 | Lo Muzio et al. |

* cited by examiner

SAMPLE RATE CONVERTER

FIELD OF THE DISCLOSURE

The present disclosure relates to initialization of digital phase lock loops in sample rate converters.

BACKGROUND

Sample rate converters are used in a variety of applications. In a television tuner, sample rate converters may be used to synchronize various input and output signals so that those signals may be processed by the tuner. The sample rate converters adjust the sample rate of the various input and output signals to a common sample rate.

In order to adjust the sample rate of the input and output signals, a digital phase lock loop may be used to generate a clock signal for the sample rate converter. The digital phase lock loop may generate the clock signal by synchronizing an external clock to a system clock. Typically, the digital phase lock loop is initialized with a starting clock rate that may be generated by digital logic. However, the digital logic used to generate the starting clock rate often includes complex computational hardware units and often consumes valuable circuit space and system power. Accordingly, there is a need for an improved system and method to generate an initial clock rate for a digital phase lock loop.

DESCRIPTION OF THE DRAWINGS

A system and method for determining a clock rate of a digital phase lock loop is disclosed. The system includes a first input to receive a first clock signal, an output to provide a second clock signal, and a dividerless initial clock rate determination module to calculate an initial clock rate value based on an reciprocal of a pulse length of the first clock signal. In a particular embodiment, the dividerless initial clock rate determination module performs a piecewise linear operation to calculate the initial clock rate value.

The method includes receiving a first edge of a pulse of a first clock signal, performing a piecewise linear calculation to determine a clock rate of the digital phase lock loop based on a reciprocal of a pulse length of the first clock signal, and providing a second clock signal having a frequency based on the determined clock rate.

Figure 1:
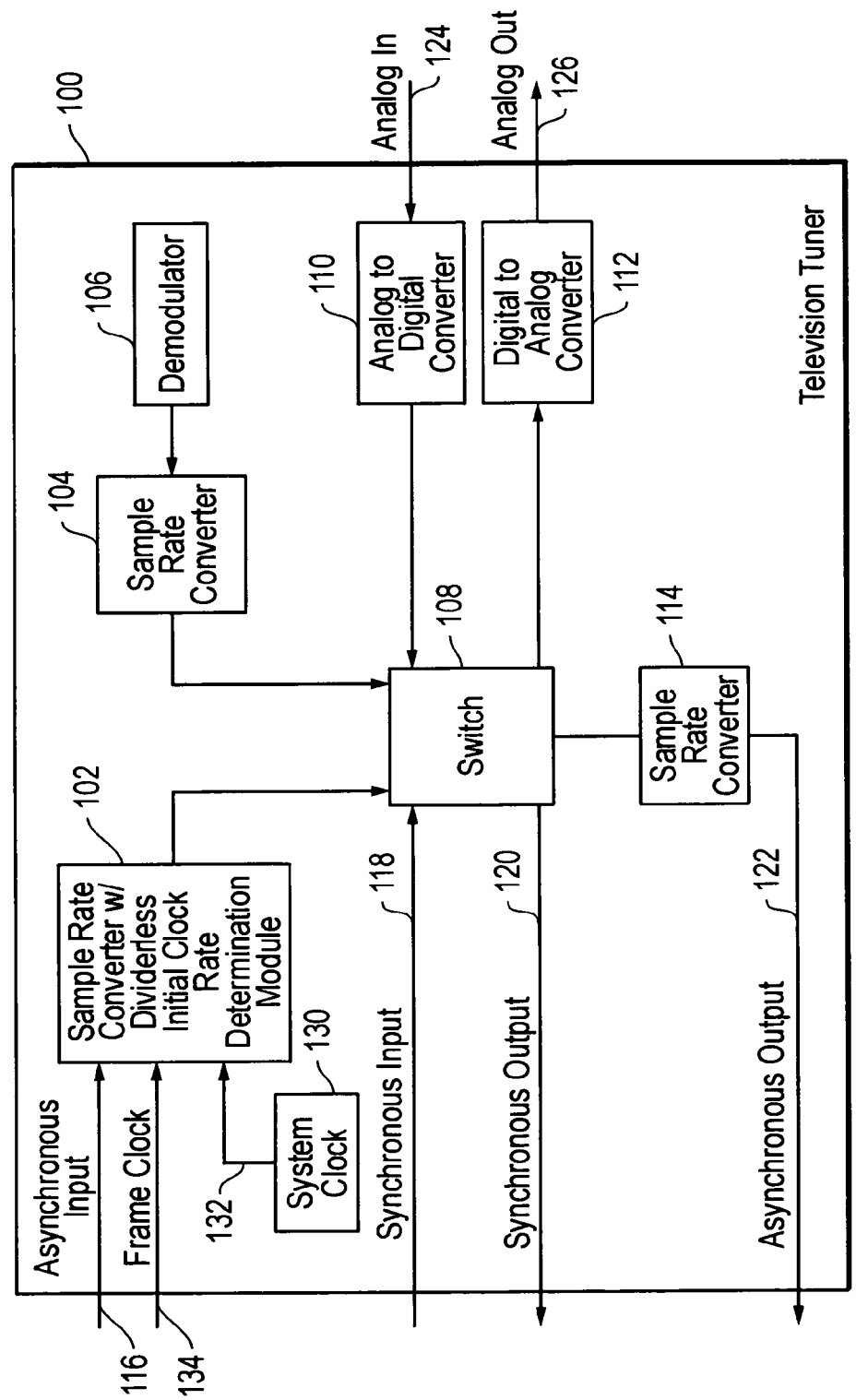
FIG. 1 is a block diagram of a particular embodiment of a television tuner 100.

FIG. 1 illustrates in block diagram form a particular embodiment of a television tuner 100. The television tuner 100 includes a sample rate converter with dividerless initial clock rate determination module 102, a first sample rate converter 104, and a demodulator 106. The television tuner 100 further includes a switch 108, an analog-to-digital converter 110, and a digital-to-analog converter 112. The system 100 further includes a second sample rate converter 114 and a system clock generator 130.

The television tuner 100 receives a variety of inputs and provides a variety of outputs. In particular the television tuner 100 receives an asynchronous input 116, and a synchronous input 118. In a particular embodiment the asynchronous input 116 and the synchronous input 118 are digital inputs. The television tuner 100 also receives an analog input signal 124. In addition the television tuner 100 receives a frame clock signal 134. In a particular embodiment, the frame clock signal 134 is associated with the asynchronous input 116 and provides information associated with the timing of frames of data provided by the asynchronous input 116. The television tuner provides a synchronous output 120 and an asynchronous output 122. In addition, the television tuner 100 provides an analog output signal 126.

The sample rate converter with the dividerless initial clock rate determination module 102 is responsive to the asynchronous input 116. The sample rate converter 102 is also responsive to the frame clock signal 134 and to a system clock signal 132 generated by the system clock module 130. The sample rate converter 104 is responsive to the demodulator 106. The analog-to-digital converter 110 is responsive to the analog input signal 124. The digital-to-analog converter 112 provides the analog output signal 126. The second sample rate converter 114 provides the asynchronous output signal 122. The switch 108 receives input signals from the sample rate converter 102, the sample rate converter 104, the synchronous input signal 118, and the analog-to-digital converter 110. The switch 108 provides the synchronous output signal 120, as well as outputs to the second sample rate converter 114 and to the digital to analog converter 112.

During operation, the switch 108 receives various input signals from the sample rate converters, the analog-to-digital converter 110, and the synchronous input 118. The switch 108 may be controlled to select from the various input signals and apply selected signals to the various output signals, including the synchronous output 120, the asynchronous output 122, and the output to the digital-to-analog converter 112. In a particular embodiment, the switch 108 is controlled by a microprocessor of the television tuner 100. By switching between the input signals and applying selected to the various output signals, the switch 108 may control the routing of various signals of the television tuner 100. For example, the asynchronous input 116 may be an I²S input signal. The switch 108 may be controlled to route this signal to the digital-to-analog converter 112 for conversion to an analog signal. The converted analog signal may then be provided as the analog output signal 126 to a television speaker or other output device.

The inputs to the television tuner 100, such as the asynchronous input 116 and the synchronous input 118, may operate at different sample rates. It may be advantageous to provide the asynchronous output 122 at a similar rate to the asynchronous input 116. Further, it may be advantageous for the output of the demodulator 106 to be converted to the same or a similar sample rate of the asynchronous input 116 and the synchronous input 118. By converting these signals so that each signal operates at a similar sample rate, the design of the switch 108 may be simplified. The sample rate converters, including the sample rate converter with dividerless initial clock rate determination module 102, the first sample rate converter 104, and the second sample rate converter 114, may be used to convert the sample rates of their respective input signals to a common or similar sample rate for the switch 108.

In a particular embodiment, it is beneficial if the sample rate of the output of the sample rate converter 102 is synchronized with the system clock 132. By synchronizing each of the outputs of the sample rate converters to the system clock 132, the switch 108 may operate more efficiently.

To convert the sample rate of the asynchronous input 116, the sample rate converter with dividerless initial clock rate determination module 102 performs a sample rate conversion based on the frame clock signal 134 and the system clock signal 132. In particular, the sample rate converter 102 may perform the sample rate conversion based on the reciprocal of a measured pulse length of the frame clock 134. Based on this reciprocal, the sample rate converter 102 may determine an initial clock rate to perform sample rate conversion. This initial clock rate may be used, for example, during a start up process of the television tuner 100. By applying the initial clock rate based on the measured inverted pulse length of the frame clock signal 134, faster sample rate conversion may result. Moreover, the determination of the reciprocal pulse length measurement is performed by the sample rate converter 102 without the expense and complexity of a divider. This allows the sample rate converter with dividerless initial clock rate determination module 102 to use less space and less power than if the circuit included a divider.

Figure 2:
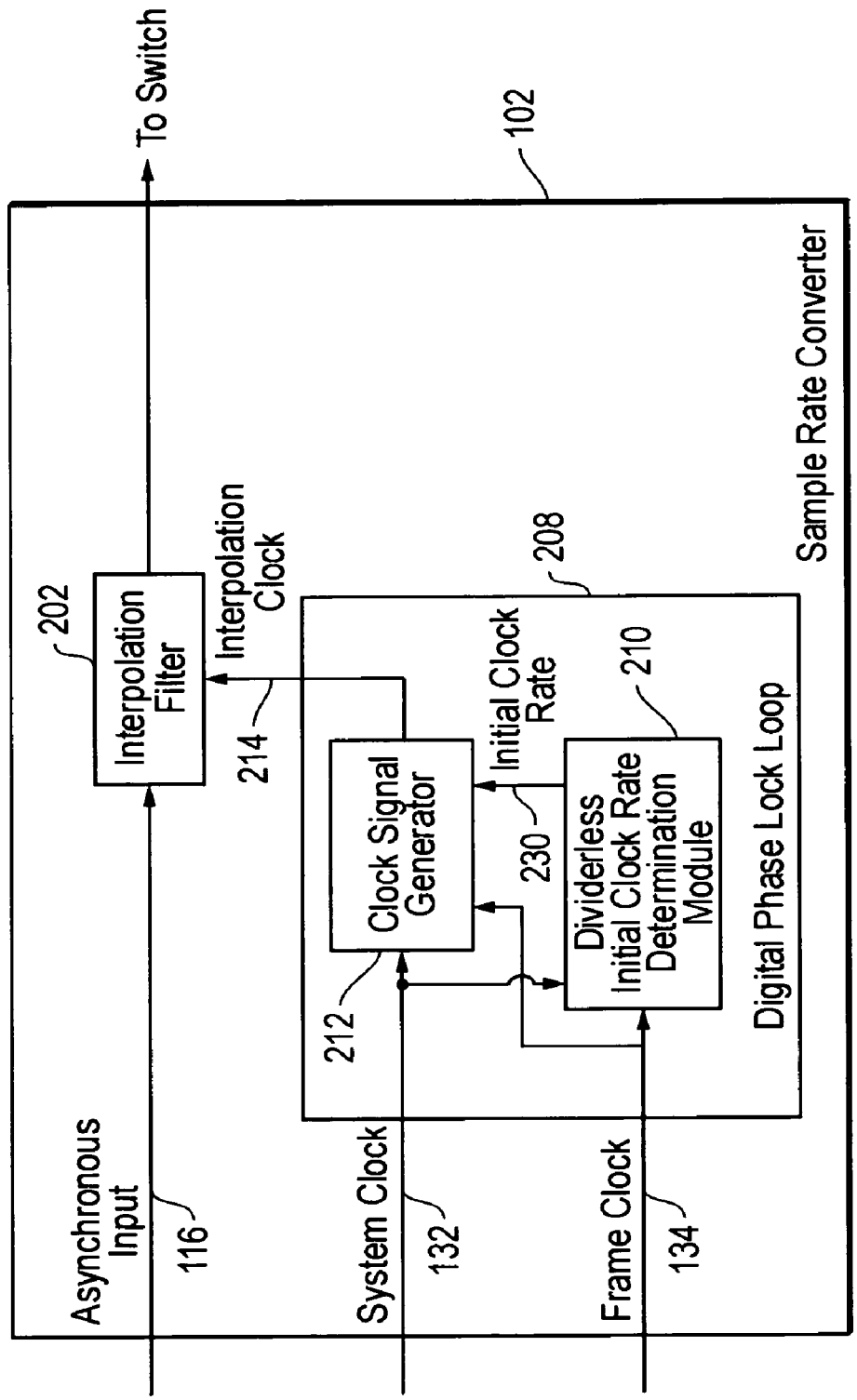
FIG. 2 is a block diagram of a particular embodiment of a sample rate converter that may be used in conjunction with the television tuner of FIG. 1.

Referring to FIG. 2, a block diagram of a particular embodiment of a sample rate converter, such as the sample rate converter with dividerless initial rate module 102 of FIG. 1 is illustrated. The sample rate converter 102 includes an interpolator filter stage 202, and a digital phase lock loop 208. The digital phase lock loop 208 includes a dividerless initial clock rate determination module 210 and a clock signal generator 212.

The interpolator filter stage 202 receives the asynchronous input signal 116. The interpolator filter stage 202 supplies an output signal that may be provided to the switch 108. The digital phase lock loop 208 receives the system clock signal 132 and the frame clock signal 134. In particular, the system clock signal 132 is provided to the clock signal generator 212 and to the dividerless initial clock rate determination module 210. The frame clock 134 is provided to the dividerless initial clock rate determination module 210 and to the clock signal generator 212. The dividerless initial clock rate determination module 210 generates an initial clock rate 230 that is provided to the clock signal generator 212. The clock signal generator 212 generates an interpolation clock signal 214.

During operation, the sample rate converter with the dividerless initial clock rate determination module 102 converts the sample rate of the asynchronous input 116. To convert the sample rate, the interpolation filter stage 202 performs a filtering and interpolation operation on the asynchronous input 116 and provides a filtered signal to switch 108. The interpolation filter stage 202 interpolates the filtered signal based on the interpolation clock signal 214. In a particular embodiment, for each pulse of the interpolation clock signal 214, the interpolation filter stage 202 calculates an intermediate interpolated sample which may be used to further calculate an output sample to the switch 108. By interpolating the input signal, the interpolation filter stage 202 changes the sample rate of the asynchronous input 116 to a desired level.

In a particular embodiment, the asynchronous input 116 is comprised of multiple frames of data. In addition, the frame clock 134 is synchronized with each frame of information of the asynchronous input 116. In a particular embodiment it is desirable that the sample rate of the output of the sample rate converter 102 be synchronized with the system clock 132. However, the frame clock 134 may not be synchronized to the system clocks of the television tuner 100, such as the system clock 132. Accordingly, the digital phase lock loop 208 is used to provide the interpolation clock signal 214 that is synchronized with both the system clock 132 and the frame clock 134.

To provide the interpolation clock signal 214, the dividerless initial clock rate determination module 210 provides an initial clock rate 230 to the clock signal generator 212. By providing this initial clock rate 230 the dividerless initial clock rate determination module 210 allows the digital phase lock loop to provide an interpolation clock signal 214 at an initial rate 230 that is close to an expected rate of the interpolation clock signal 214. By providing this initial clock rate 230 the digital phase lock loop 208 can more quickly synchronize the system clock 132 and the frame clock 134.

After the interpolation clock signal 214 has been provided at the initial clock rate, the clock signal generator 212 synchronizes the interpolation clock signal 214 with the system clock 132. For example, in a particular embodiment, the clock signal generator 212 may incrementally adjust the phase of the interpolation clock signal 214 until it is synchronized with the frame clock signal 134. The clock signal generator 212 may continue to adjust the characteristics, such as the phase and frequency, of the clock signal 214 to compensate for variation in the characteristics of the system clock 132 or the frame clock 134.

The dividerless initial clock rate determination module 210 determines the initial clock rate 230 based on the reciprocal of a pulse length of a pulse of the frame clock 134. The dividerless initial clock rate determination module 210 determines the inverse value without performing a division operation. In a particular embodiment, the dividerless initial clock rate determination module 210 performs a piece wise linear operation to determine the initial clock rate 230.

Figure 3:
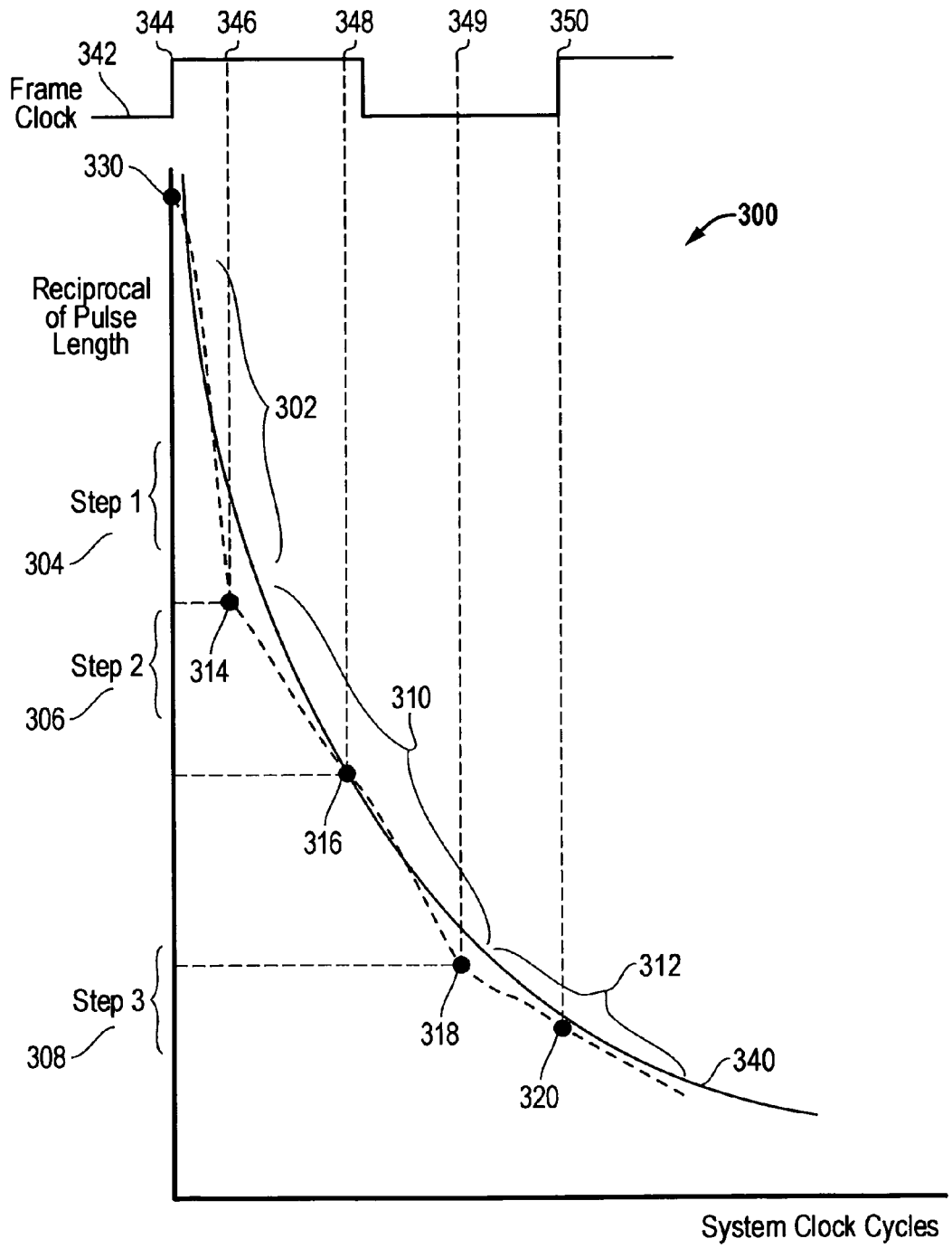
FIG. 3 is a graphical representation of a piecewise linear operation that may be performed by the system of FIG. 2.

Referring to FIG. 3, a graphical representation of a piecewise linear operation, such as may be performed by the dividerless initial clock rate determination module 210 of FIG. 2, is illustrated. The piecewise linear operation is represented by the graph 300, including an x-axis representing the cycles of a system clock, such as the system clock 132 of FIG. 2, and including a y-axis that represents the reciprocal of the pulse length of pulses of the frame clock signal 342. The graph 300 includes an expected curve 340. The expected curve 340 indicates the expected value of the reciprocal of the pulse length of the measured pulses of the frame clock signal 342 over a number of system clock cycles. The graph 300 also illustrates a series of piecewise linear curves including a first curve 302, a second curve 310, and a third curve 312.

The frame clock signal 342 includes a first edge 344 and a second edge 350. In a particular embodiment, the pulse length of the frame clock signal 342 is the time between the first edge 344 and the second edge 350. The pulse of the frame clock signal 342 may be divided into several portions. For example, the time between the first edge 344 and a first point 346 is a first portion of the pulse, and the time between the first time 346 and a second time 349 is a second portion of the pulse.

To perform a piecewise linear calculation to determine the reciprocal of the pulse length of the frame clock signal 342, the y-intercept value 330 may be stored in an accumulator in response to the first edge 344. The y-intercept value 330 may be chosen to correspond closely with the expected value curve 340. The y-intercept value 330 may be chosen based on the expected range of the pulse length of the frame clock signal 342. For example, if the minimum pulse length of the frame clock signal 342 is known based on normal system operating conditions, the y-intercept value may be determined by calculating the reciprocal of this pulse length, and determining the y-intercept of a line passing through this expected reciprocal.

During a first portion of the pulse, after the first edge 344 is detected and until the first time 346, the value in the accumulator may be decremented by a first step size 304 for each system clock cycle. The first step size 304 may be chosen to approximate the slope of the expected curve 340 in the region of the first curve 302.

When the value in the accumulator reaches a first predetermined value 314, at first time 346, the value of the step size is changed from the first step size 304 to the second step size 306. The first predetermined value 314 and the second step size 306 are selected such that the difference between the first predetermined value 314 and the value of the expected value curve 340 is below a threshold. In a particular embodiment, the threshold is about 2.5 percent. In another particular embodiment, the first predetermined value 314 is chosen such that, at a particular condition 316, wherein the second edge 350 occurs at time 348, the value and slope of the piecewise linear approximation exactly matches the expected value curve 340. In still another particular embodiment, the step sizes are chosen to be powers of two, such that changing the value of the step size comprises a shift operation.

The accumulator is decremented at the second step size 306 during receipt and measurement of a second portion of the pulse of the frame clock signal 342 until the accumulator reaches the second predetermined value 318 at the second time 349. In response, the step size is changed to the third step size 308.

The accumulator is decremented by the third step size until the end of the pulse 350 is detected. The value in the accumulator at that point is the value 320. This value represents the reciprocal of the pulse length of the frame clock 342. It will be appreciated by one skilled in the art that this process of comparing the accumulator with predetermined values and adjusting the step size can be repeated additional times until the maximum know pulse length of the frame clock signal 342 is reached, or until the step size reaches some minimum value, such as one.

Figure 4:
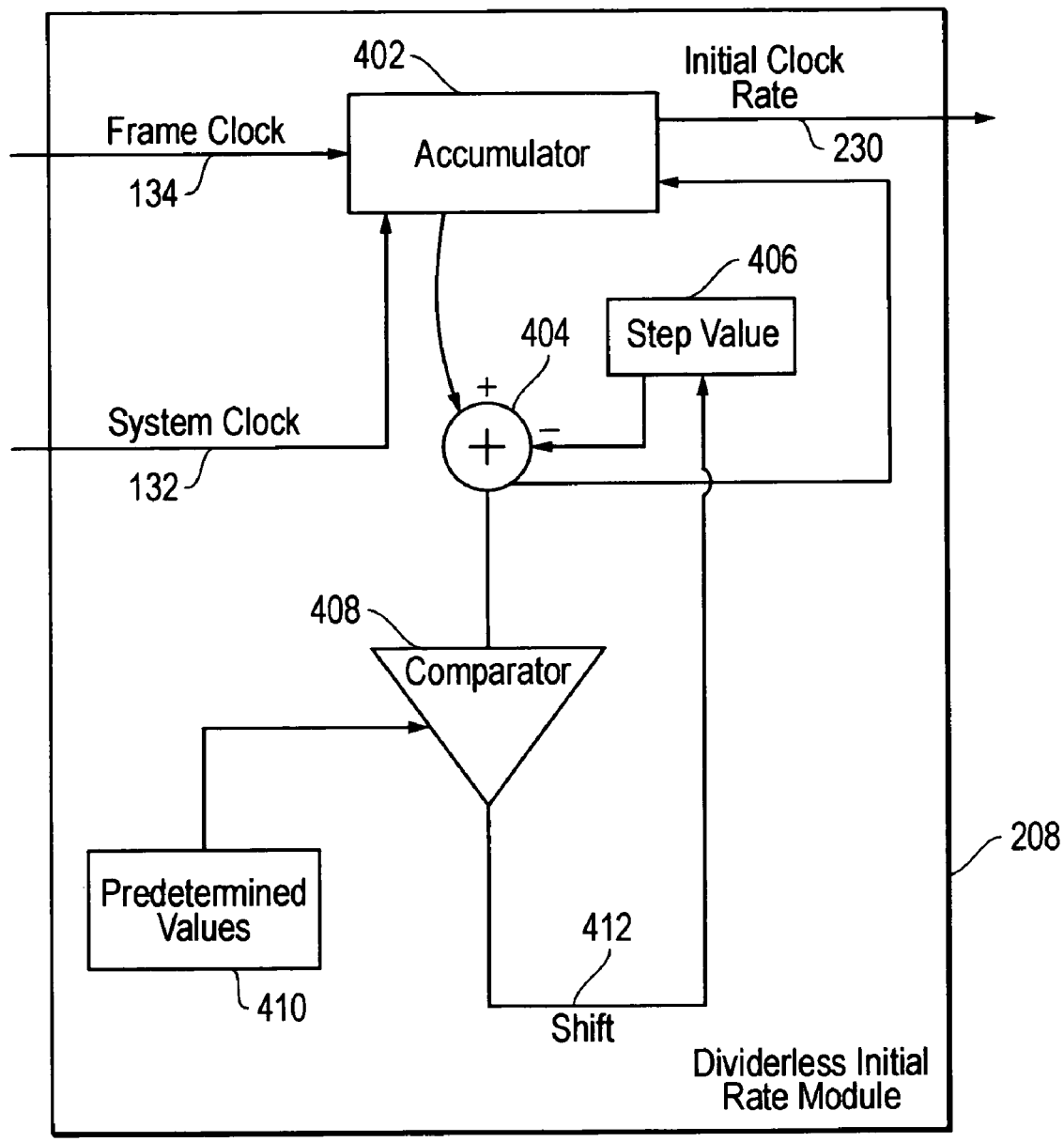
FIG. 4 is a block diagram of a particular embodiment of a dividerless initial clock rate determination module that may be used in conjunction with the sample rate converter of FIG. 2.

Referring to FIG. 4, a block diagram of a particular embodiment of a dividerless initial clock rate determination module, such as the dividerless initial clock rate determination module 208 of FIG. 2, is illustrated. The dividerless initial clock rate determination module 208 includes an accumulator 402, an adder 404, a step value register 406, a comparator 408, and a predetermined value register 410. The accumulator 402 is responsive to the frame clock 134 and the system clock 132. The accumulator 402 provides the initial clock rate 230. The adder 404 performs an addition operation on an output of the accumulator 402 and an output of the step value register 406. The accumulator 402 is responsive to a first output of the adder 404 and the comparator 408 is responsive to a second output of the adder 404. The step value register 406 is responsive to a shift output 412 of the comparator 408. The comparator 408 is responsive to the predetermined value register 410.

During operation, the accumulator 402 is loaded with an initial value after detecting a first edge of the frame clock 134. The initial value may represent a y-intercept value, such as the y-intercept value 330 of FIG. 3. The step value register 406 contains a step value. During each cycle of the system clock 132, the adder 404 subtracts the step value register 406 from the contents of the accumulator 402 and stores this result in the accumulator 402. After each clock cycle, the accumulator represents a piecewise linear approximation of a corresponding point on a reciprocal curve, such as the expected value curve 340 of FIG. 3.

The predetermined value register 410 stores one or more predetermined values. The comparator 408 compares the output of the adder 404 to the predetermined values stored in the predetermined value register 410. When the output of the adder is about the same as one of the predetermined values, the comparator 408 provides the shift signal 412 to the step value register 406. The shift signal 412 shifts the step value stored in the step value register 406. After a second edge of the frame clock 134, the accumulator 402 provides the initial clock rate 230.

By subtracting the step value register 406 from the accumulator 402 repeatedly, and shifting the step value register 406 when each of the predetermined values 410 are reached, the dividerless initial clock rate determination module performs a piece wise linear operation to approximate a value for the initial clock rate 230. The initial clock rate 230 is thereby based on a reciprocal of a pulse length of the frame clock 134.

In addition, the hardware components of the dividerless initial clock rate determination module, such as the accumulator 402 and the adder 404, may be used for other system operations. In a particular embodiment, the accumulator 402 and the adder 404 are also used for digital filtering operations. By using the hardware components of the dividerless initial clock rate determination module for other system operations, system resources may be used more efficiently, and circuit area and power may be saved.

Figure 5:
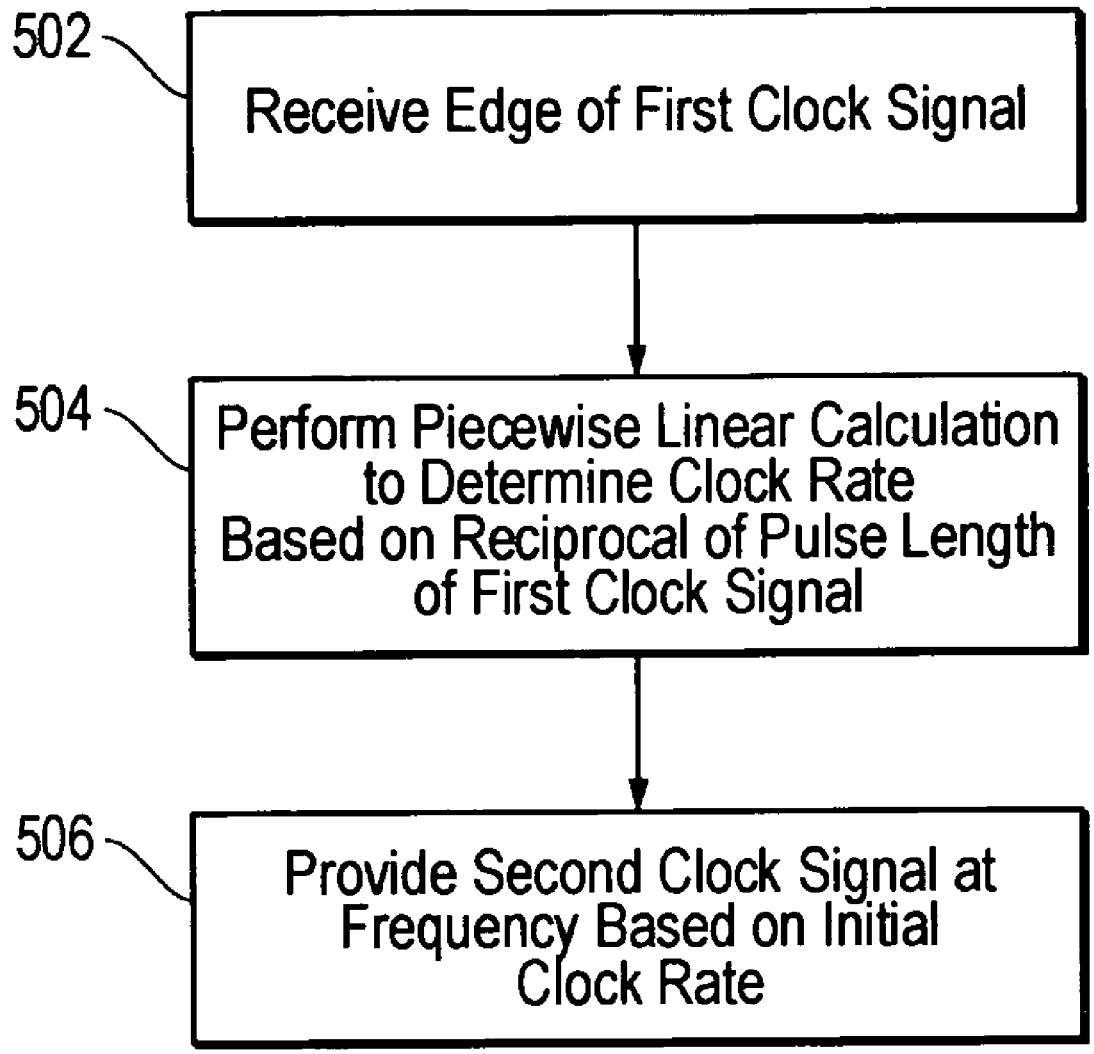
FIG. 5 is a flow chart of a method of determining a clock rate for a phase lock loop.

Referring to FIG. 5, a method of determining a clock rate for a phase lock loop is illustrated. At step 502 an edge of a first clock signal is received. The edge of the first clock signal indicates that measurement of a reciprocal of the pulse length of the clock signal should begin. At step 504 a piece wise linear calculation is performed to determine the initial clock rate. The initial clock rate is based on a reciprocal of a pulse length of a first clock signal, such as the frame clock signal 132. Moving to step 506, a second clock signal is provided at an initial frequency, where the initial frequency is based on the clock rate. The second clock signal may be used to perform an interpolation operation on an input signal in a sample rate converter. Determining the initial clock rate by performing the piece wise linear calculation does not require the use of a divider, thereby saving circuit space and power.

Figure 6:
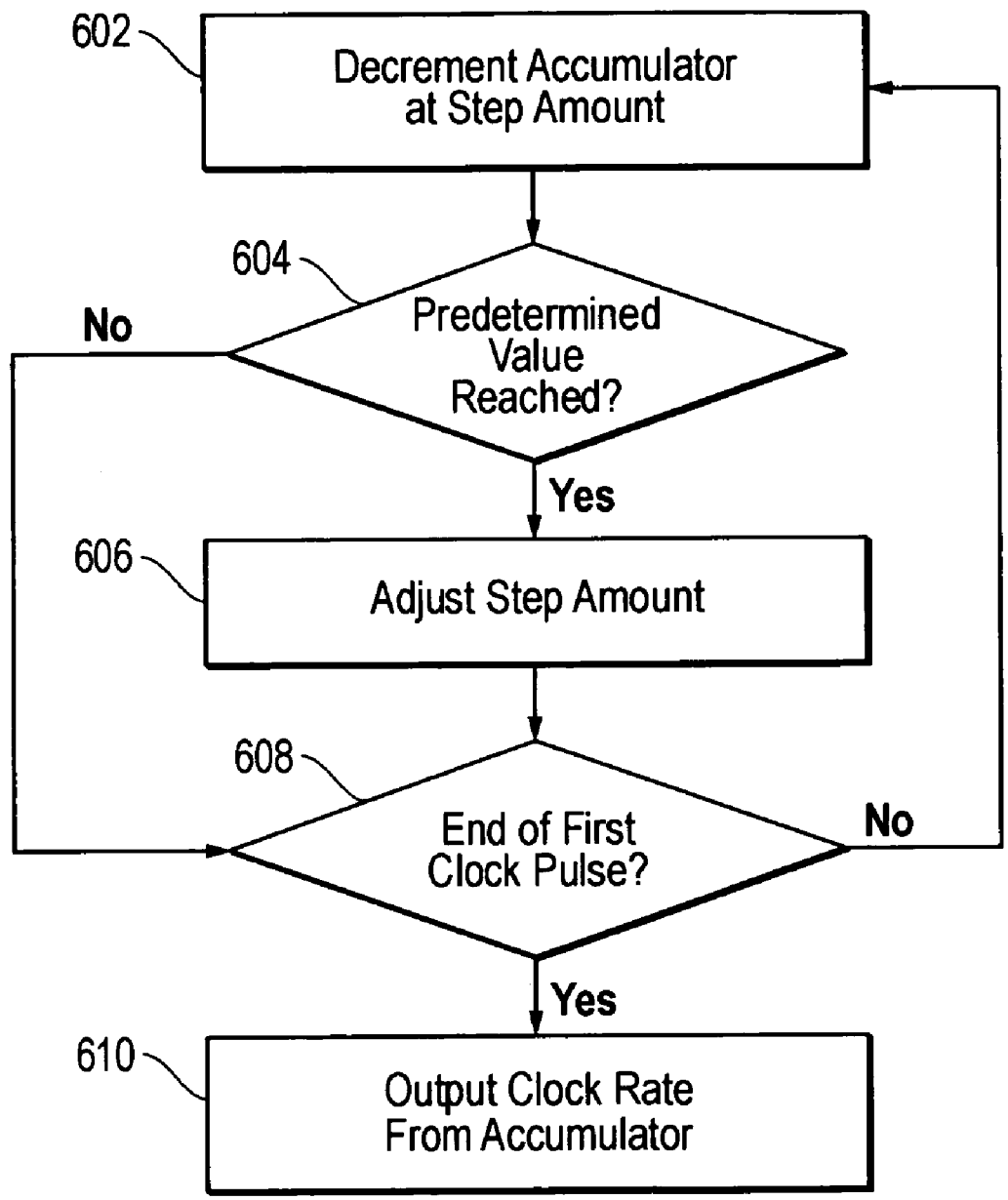
FIG. 6 is a flow chart of a method of performing a piecewise linear operation.

Referring to FIG. 6 a method of determining an initial clock rate of a phase lock loop is illustrated. At step 602 an accumulator is decremented at a first step amount. The accumulator stores an initial value representing a y intercept of a first linear curve to approximate a reciprocal value curve. The reciprocal value curve represents expected values of a reciprocal of a pulse length of a first clock signal, such as the frame clock signal 134. By decrementing the accumulator by the step amount, a linear approximation of the reciprocal value curve is achieved. Moving to decision step 604 it is determined whether a predetermined value has been reached. If the predetermined value has been reached, the method moves to step 606 and the step amount is adjusted. By adjusting the step amount, the adjustment of the accumulator more closely matches the shape of the reciprocal value curve. Returning to step 604, if the predetermined value has not been reached the method moves to step 608 and it is determined whether an end of the first clock pulse has been detected. If an end of the first clock pulse has not been detected, the method returns to step 602 and the accumulator continues to be decremented at the step amount. If at decision step 608 an end of the first clock pulse is detected, the method moves to step 610 and the calculated initial clock rate is output from the accumulator.

The initial clock rate may be used by a clock generator of a phase lock loop, such as the clock signal generator 212. By using the initial clock rate, the phase lock loop may more quickly synchronize an output clock signal with the first clock signal.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A digital phase lock loop, comprising:
   a first input to receive a first clock signal;
   an output to provide a second clock signal, the second clock signal based on the first clock signal; and
   a dividerless initial clock rate determination module to calculate an initial clock rate value based on a reciprocal of a measured pulse length of the first clock signal,
   wherein the dividerless initial clock rate determination module comprises an accumulator and a comparator;
   wherein in a first mode of operation the accumulator and the comparator are operable to calculate the initial clock rate value and wherein in a second mode of operation the accumulator and the comparator are operable to perform a digital filtering operation; and
   wherein the dividerless initial clock rate determination module includes a register to store a step size, an adder to subtract the step size from an initial value stored in the accumulator, and wherein the comparator compares an output of the adder to a predetermined adjustment value, wherein the step size is adjusted based on an output of the comparator.

2. The digital phase lock loop of claim 1, wherein a clock rate of the second clock signal is based on the initial clock rate value.

3. The digital phase lock loop of claim 1, wherein the dividerless initial clock rate determination module performs a piecewise linear operation to calculate the initial clock rate value.

4. The digital phase lock loop of claim 3, wherein the dividerless initial clock rate determination module performs the piecewise linear operation using a first step size during a first time period and using a second step size during a second time period.

5. The digital phase lock loop of claim 1, wherein the first clock signal is a frame clock signal and further comprising:
   a second input to receive a third clock signal that comprises a system clock signal.

6. The digital phase lock loop of claim 1, wherein the second clock signal is provided to an interpolation filter.

7. The digital phase lock loop of claim 1, further comprising:
   a clock signal generator responsive to the first clock signal, wherein the clock signal generator generates the second clock signal.

8. A dividerless initial clock rate determination module, comprising
   an input to receive a clock signal;
   a dividerless logic module to determine an initial clock rate value by calculating a reciprocal of a measured pulse length of the clock signal; and
   an output to provide the initial clock rate value;
   wherein the dividerless logic module performs a piecewise linear calculation to calculate the initial clock rate value;
   wherein the dividerless logic module comprises an accumulator to store an initial value, a register to store a step size, an adder to subtract the step size from the initial value stored in the accumulator, and a comparator to compare an output of the adder to a predetermined adjustment value, wherein the step size is adjusted based on an output of the comparator; and
   wherein the predetermined adjustment value and the step size are chosen such that, at a particular system operating condition, the initial value and a slope of the piecewise linear calculation substantially match the reciprocal of the measured pulse length of the clock signal.

9. The dividerless initial clock rate determination module of claim 8, wherein the step size is a power of two, and wherein the step size is adjusted using a shift operation.

10. The dividerless initial clock rate determination module of claim 8, wherein the initial clock rate value is based on a value stored in the accumulator.

11. A sample rate converter, comprising:
    an interpolation filter stage responsive to a digital input signal; and
    a digital phase lock loop, including:
       a first input to receive a first clock signal;
       an output to provide a second clock signal, the second clock signal based on the first clock signal, wherein the interpolation filter stage is responsive to the second clock signal; and
       a dividerless initial clock rate determination module to calculate an initial clock rate value based on reciprocal of a pulse length of the first clock signal;
       wherein the dividerless initial clock rate determination module comprises an accumulator and a comparator;
       wherein in a first mode of operation the accumulator and the comparator are operable to calculate the initial clock rate value and wherein in a second mode of operation the accumulator and the comparator are operable to perform a digital filtering operation; and
    wherein the dividerless initial clock rate determination module includes a register to store a step size, an adder to subtract the step size from an initial value stored in the accumulator, and wherein the comparator compares an output of the adder to a predetermined adjustment value, wherein the step size is adjusted based on an output of the comparator.

12. The sample rate converter of claim 11, wherein a rate of the second clock signal is based on the initial clock rate value.

13. The sample rate converter of claim 11, wherein the dividerless initial clock rate determination module performs a piecewise linear operation to calculate the initial clock rate value.

14. The sample rate converter of claim 11, wherein the interpolation filter stage provides a sample rate converted output to a switch of a television tuner.

15. A method of controlling a digital phase lock loop, comprising:
    receiving a first edge of a pulse of a first clock signal;
    performing a piecewise linear calculation to determine a clock rate of the digital phase lock loop based on a reciprocal of a pulse length of the pulse of the first clock signal;
    providing a second clock signal having a frequency based on the determined clock rate;
    storing an initial value at an accumulator;
    storing a step size at a register;

subtracting, by an adder, the step size from the initial value stored at the accumulator; and comparing an output of the adder to a predetermined adjustment value at a comparator, wherein the step size is adjusted based on an output of the comparator; and wherein the predetermined adjustment value and the step size are chosen such that, at a particular system operating condition, the initial value and a slope of the piecewise linear calculation substantially match the reciprocal of the pulse length of the pulse of the first clock signal.

16. The method of claim 15, wherein performing the piecewise linear calculation further includes decrementing the accumulator by a second step size during detection of a second portion of the pulse of the first clock signal.

* * * * *